US010964779B2

(12) United States Patent
Lai et al.

(10) Patent No.: US 10,964,779 B2
(45) Date of Patent: Mar. 30, 2021

(54) VERTICAL PLATE CAPACITORS EXHIBITING HIGH CAPACITANCE MANUFACTURED WITH DIRECTED SELF-ASSEMBLY

(71) Applicant: international Business Machines Corporation, Armonk, NY (US)

(72) Inventors: Kafai Lai, Poughkeepsie, NY (US); Rasit Onur Topaloglu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 16/188,467

(22) Filed: Nov. 13, 2018

(65) Prior Publication Data

US 2020/0152730 A1 May 14, 2020

(51) Int. Cl.
H01L 49/02 (2006.01)
H01L 29/40 (2006.01)
H01L 21/311 (2006.01)
H01L 21/02 (2006.01)

(52) U.S. Cl.
CPC ........ *H01L 28/60* (2013.01); *H01L 21/02118* (2013.01); *H01L 21/31144* (2013.01); *H01L 29/401* (2013.01)

(58) Field of Classification Search
CPC ............... H01L 28/60; H01L 21/02118; H01L 21/31144; H01L 29/401
USPC ....................................................... 257/532
See application file for complete search history.

(56) References Cited

U.S. PATENT DOCUMENTS

| 5,770,987 | A | 6/1998 | Henderson |
| 6,451,667 | B1 | 9/2002 | Ning |
| 6,524,926 | B1 * | 2/2003 | Allman ............. H01L 21/76838 |
| | | | 257/E21.009 |
| 6,677,635 | B2 | 1/2004 | Ning et al. |
| 6,693,017 | B1 | 2/2004 | Fayaz et al. |
| 6,713,395 | B2 | 3/2004 | Ning |

(Continued)

FOREIGN PATENT DOCUMENTS

CN 102779733 A 11/2012

OTHER PUBLICATIONS

F.-L, Lin, et al. "Coplanar Waveguide Bandpass Filter-A Ribbon-of-Brick-Wall Design," IEEE Transactions on Microwave Theory arid Techniques, Jul. 1995, pp. 1589-1596, vol. 43, No. 7.

*Primary Examiner* — Hrayr A Sayadian
(74) *Attorney, Agent, or Firm* — Robert Sullivan; Ryan, Mason & Lewis, LLP (57) ABSTRACT

A semiconductor structure includes a substrate and a first trench including a dielectric material disposed in the substrate. The first trench includes a transferred pattern of a first polymer of a directed self-assembly stack including the first polymer and a second polymer. The semiconductor structure also includes a second trench including a first vertical metal plate disposed in the substrate adjacent a first sidewall of the first trench, and a third trench including a second vertical metal plate disposed in the substrate adjacent a second sidewall of the first trench. The first vertical metal plate in the second trench, the dielectric material in the first trench, and the second vertical metal plate in the third trench provide a metal-insulator-metal vertical plate capacitor.

20 Claims, 7 Drawing Sheets (56) References Cited

U.S. PATENT DOCUMENTS

| | | | |
|---|---|---|---|
| 6,960,365 B2 | 11/2005 | Ning | |
| 7,022,246 B2 | 4/2006 | Chinthakindi et al. | |
| 7,186,625 B2 | 3/2007 | Chudzik et al. | |
| 7,282,404 B2 | 10/2007 | Coolbaugh et al. | |
| 7,687,867 B2 | 3/2010 | Coolbaugh et al. | |
| 7,816,197 B2 | 10/2010 | Kim et al. | |
| 7,837,459 B2 * | 11/2010 | Colburn | G03F 7/0002 |
| | | | 425/385 |
| 8,143,659 B2 | 3/2012 | Pompl | |
| 8,871,621 B2 | 10/2014 | Ananthan et al. | |
| 8,976,565 B2 | 3/2015 | Phatak | |
| 9,006,783 B2 | 4/2015 | Di Sarro et al. | |
| 9,012,296 B2 | 4/2015 | Weng et al. | |
| 9,048,339 B2 | 6/2015 | Cheng et al. | |
| 9,059,322 B2 | 6/2015 | Barth, Jr. et al. | |
| 9,076,758 B2 | 7/2015 | Lindert | |
| 9,171,848 B2 | 10/2015 | Dyer et al. | |
| 9,177,998 B2 | 11/2015 | Ananthan et al. | |
| 9,178,080 B2 | 11/2015 | Kalnitsky et al. | |
| 9,209,190 B2 | 12/2015 | Chen et al. | |
| 9,224,797 B2 | 12/2015 | Barth, Jr. et al. | |
| 9,343,523 B2 | 5/2016 | Phatak | |
| 9,379,177 B2 | 6/2016 | Cheng et al. | |
| 9,385,179 B2 | 7/2016 | Nakos et al. | |
| 9,397,233 B2 | 7/2016 | Zhu et al. | |
| 9,443,922 B2 | 9/2016 | Kobrinsky et al. | |
| 9,472,690 B2 | 10/2016 | Weng et al. | |
| 9,576,096 B2 | 2/2017 | Chan et al. | |
| 9,583,557 B2 | 2/2017 | Cheng et al. | |
| 9,679,917 B2 | 6/2017 | Donaton et al. | |
| 9,741,657 B2 | 8/2017 | Filippi et al. | |
| 9,754,945 B2 | 9/2017 | Cartier et al. | |
| 9,793,341 B1 | 10/2017 | Khakifirooz et al. | |
| 9,876,007 B1 | 1/2018 | Cohen et al. | |
| 9,892,970 B2 | 2/2018 | Farooq et al. | |
| 2008/0160754 A1 * | 7/2008 | Fitzsimmons | H01L 21/02063 |
| | | | 438/626 |
| 2011/0204523 A1 * | 8/2011 | Arnold | G03F 7/38 |
| | | | 257/773 |
| 2012/0329272 A1 * | 12/2012 | Arnold | H01L 21/0337 |
| | | | 438/653 |
| 2013/0216776 A1 * | 8/2013 | Arnold | H01L 23/5226 |
| | | | 428/141 |
| 2018/0122797 A1 | 5/2018 | Bi et al. | |
| 2018/0287060 A1 * | 10/2018 | Ando | H01L 45/08 |
| 2019/0198327 A1 * | 6/2019 | Chung | H01L 21/28158 |
| 2019/0318928 A1 * | 10/2019 | Mignot | H01L 21/3086 |

* cited by examiner

☐ = GUIDING PATTERN

VERTICAL PLATE CAPACITORS EXHIBITING HIGH CAPACITANCE MANUFACTURED WITH DIRECTED SELF-ASSEMBLY

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming vertical plate capacitors exhibiting high capacitance.

In one embodiment, a method of forming a semiconductor structure comprises forming a first trench in a substrate by transferring a patterning of a first polymer of a directed self-assembly stack, the directed self-assembly stack comprising the first polymer and a second polymer, forming a dielectric material in the first trench, forming a second trench in the substrate adjacent a first sidewall of the first trench, forming a third trench in the substrate adjacent a second sidewall of the first trench, forming a first vertical metal plate in the second trench, and forming a second vertical metal plate in third trench. The first vertical metal plate in the second trench, the dielectric material in the first trench, and the second vertical metal plate in the third trench form a metal-insulator-metal vertical plate capacitor.

In another embodiment, a semiconductor structure comprises a substrate, a first trench comprising a dielectric material disposed in the substrate, the first trench comprising a transferred pattern of a first polymer of a directed self-assembly stack comprising the first polymer and a second polymer, a second trench comprising a first vertical metal plate disposed in the substrate adjacent a first sidewall of the first trench, and a third trench comprising a second vertical metal plate disposed in the substrate adjacent a second sidewall of the first trench. The first vertical metal plate in the second trench, the dielectric material in the first trench, and the second vertical metal plate in the third trench provide a metal-insulator-metal vertical plate capacitor.

In another embodiment, an integrated circuit comprises a metal-insulator-metal vertical plate capacitor comprising a substrate, a first trench comprising a dielectric material disposed in the substrate, the first trench comprising a transferred pattern of a first polymer of a directed self-assembly stack comprising the first polymer and a second polymer, the dielectric material in the first trench providing the insulator of the metal-insulator-metal vertical plate capacitor, a second trench comprising a first vertical metal plate of the metal-insulator-metal vertical plate capacitor disposed in the substrate adjacent a first sidewall of the first trench, and a third trench comprising a second vertical metal plate of the metal-insulator-metal vertical plate capacitor disposed in the substrate adjacent a second sidewall of the first trench.

DETAILED DESCRIPTION

Illustrative embodiments of the invention may be described herein in the context of illustrative methods for forming vertical plate capacitors exhibiting high capacitance, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

Capacitors are used to store charge in integrated circuits such as in dynamic random-access memory (DRAM) and analog circuit blocks. However, the growing demand for smaller and more cost effective semiconductor devices has pushed the development of miniaturized structures for sub-micron technologies. Such miniaturization, however, has limits. As the size of capacitors becomes increasingly large relative to the circuit itself, the capacitors take up considerable chip real estate.

Deep trench capacitors may be used to add capacitance to various types of integrated circuit devices and structures, including but not limited to memory cells, decoupling capacitor arrays, etc. A deep trench capacitor comprises a deep trench in a semiconductor substrate, with a doped region within the substrate adjacent to the trench forming one capacitor plate (e.g., a buried capacitor plate), a dielectric layer lining the trench forming the capacitor dielectric, and a conductive fill material within the trench forming another capacitor plate. As circuit structures continue to scale (e.g., to 7 nanometers (nm) and beyond), however, deep trench capacitors may no longer be an option for forming high capacitance capacitors.

One alternative to deep trench capacitors is to utilize metal-insulator-metal (MIM) capacitors (MIM-caps). MIM-caps, however, are generally only available at the far back end of line (FBEOL) and are thus not optimal for front end of line (FEOL) circuit usage. For example, routing to the FBEOL adds resistance, impacts timing, and occupies more chip area due to the routing. There is thus a need for forming high capacitance elements close to the FEOL (e.g., where deep trench capacitors would be located).

Monolithic decoupling capacitors require high capacitance per unit area:

$$C = \frac{\varepsilon_r \varepsilon_0}{d} A$$

where d represents the distance between the capacitor plates, A is the capacitor area, $\varepsilon_0$ is the value of the permittivity for air, and $\varepsilon_r$ is the permittivity of the dielectric medium used between the two plates of the capacitor.

To increase capacitance or C, there are a number of options. One option is to increase the dielectric constant of the insulator layer (e.g., $\varepsilon_r$) by using a high dielectric gap fill material. Another option is to increase the area of the facing capacitor pads, such as by using long, serpentine-type designs. Still another option is to decrease the thickness of the insulator layer, which is limited by resolution for vertical plate capacitors.

Illustrative embodiments provide techniques for forming vertical plate capacitors exhibiting high capacitance. Some embodiments form the vertical plate capacitors using directed self-assembly (DSA) techniques, which reduce the distance d between the capacitor plates. Deep ultraviolet (DUV) lithography may be used to print merged plate area patterns. A merged plate area in this context is the combined area occupied by the capacitor pads and the dielectric gap in between. Graphoepitaxy DSA is used to form an extremely narrow gap d between the capacitor plates.

With conventional DUV lithography, guiding patterns with a width of ~2 L0 (e.g., ~56 nm) can be printed and transferred, where L0 is the lower bound of contact pitch separation beyond which DSA becomes unreliable. Extreme ultraviolet (EUV) lithography may yield down to an approximately 20 nm gap, but EUV lithography may be too costly for manufacturing vertical decoupling capacitors.

In some embodiments, lamella block copolymers are used to form narrow minority domain of ~½L0 (e.g., 14 nm). This narrow minority domain cannot be resolved with optical lithography. The minority domain of the block copolymer is then selectively removed. Tuned etch processes (e.g., that give a negative etch bias) are used to further shrink the gap or distance d to below 10 nm in some embodiments.

Using the techniques described herein, vertical plate capacitors exhibiting high capacitance may be formed. For a traditional capacitor, the distance d may be 5 nm and $\varepsilon_r$ may be 2.7. Assuming a 20 nm wide line with 20 nm gap and 25 fingers, the capacitance C=2.99 femtoFarads (fF). For a MIMcap, the distance d may be 5 nm and $\varepsilon_r$ may be 12, with a resulting capacitance C=21.2fF. With the techniques described herein, a vertical plate capacitor with d=5 nm and $\varepsilon_r$=8 (and assuming one dielectric every 36 nm) has a capacitance C=19.7 fF. Thus, vertical plate capacitors formed using the techniques described herein may have capacitance seven times that of a traditional capacitor, or capacitance comparable to a MIMcap but which can be achieved close to FEOL layers. Advantages of vertical plate capacitors formed using the techniques described herein thus include very competitive capacitance, reduced resistance of the path to capacitance, and reduced timing as the structures are advantageous for routing since they are close to FEOL.

Illustrative processes for forming vertical plate capacitors exhibiting high capacitance will now be described with respect to FIGS. 1-15.

Figure 1:
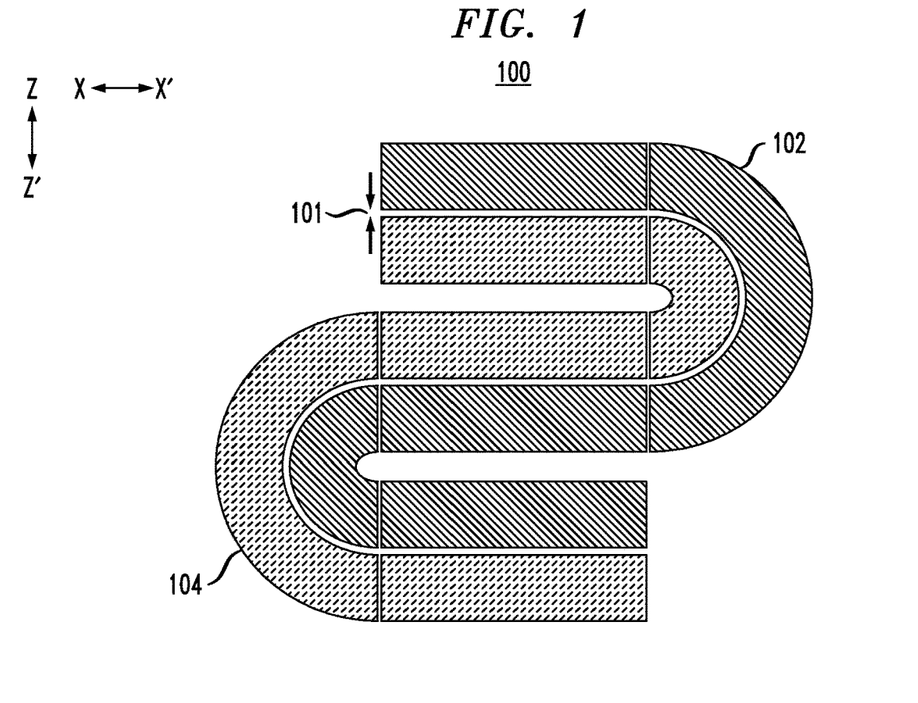
FIG. 1 depicts a top-down view of a vertical plate capacitor structure, according to an embodiment of the invention.

FIG. 1 shows a top-down view 100 of a vertical plate capacitor structure, including a first plate 102 and a second plate 104 formed using a serpentine structure with a number of "unit structures" (e.g., the roundabout sections connecting the linear sections, shown via the narrow gaps in the first plate 102 and second plate 104). Advantageously, the roundabouts enable the structure to skip connections to upper or lower layers across capacitance terminals. The first plate 102 and second plate 104 are separated by a gap 101. The gap 101 is advantageously very small (e.g., less than 10 nm). The first plate 102 and second plate 104 may be formed using DSA techniques described in further detail below.

The first plate 102 may be formed of a metal, highly doped polysilicon, or another suitable material. The first plate 102 may have a thickness in the range of tens of nanometers (nm) to several micrometers (μm), although other thicknesses above or below this range may be used as desired for a particular application. The second plate 104, in some embodiments, is formed of the same material as the first plate. In other embodiments, the first plate 102 and second plate 104 may be formed of different materials.

Figure 2:
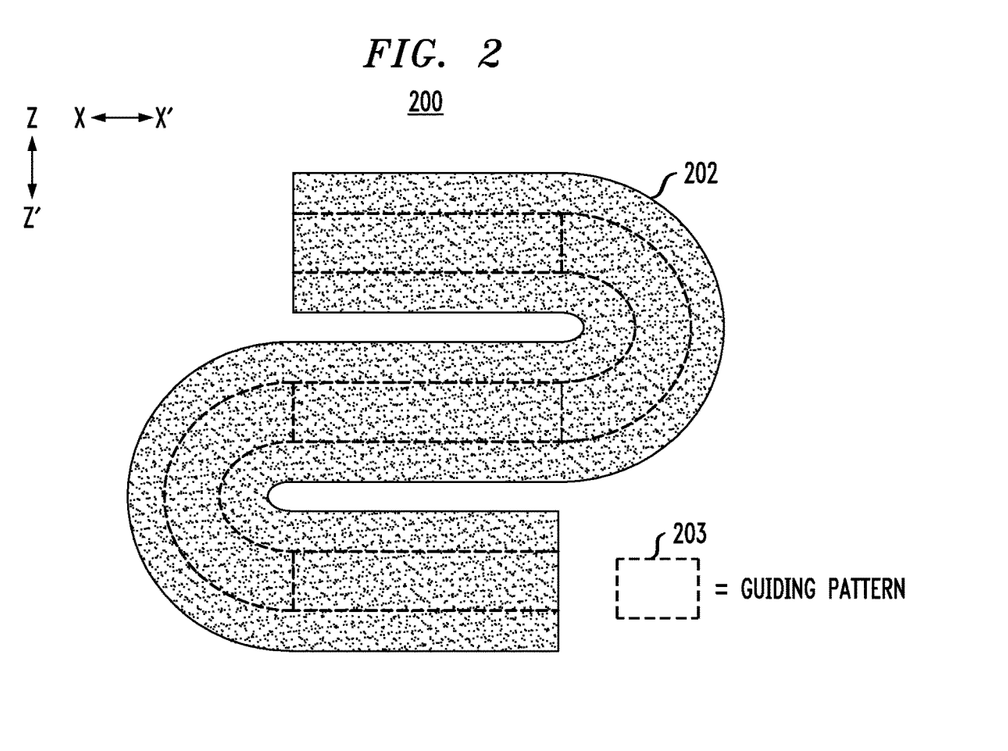
FIG. 2 depicts a top-down view of a guiding pattern used to form the FIG. 1 vertical plate capacitor structure, according to an embodiment of the invention.

FIG. 2 shows a top-down view 200 of a guiding pattern 203 that may be used to form the FIG. 1 vertical plate capacitor structure from a merged plate area 202 using DSA techniques described in further detail below. As discussed above, with conventional DUV lithography, the guiding pattern 203 generally has a width of approximately twice the pitch of separation or L0. Illustrative embodiments use DSA with lamella block copolymers to form a narrow minority domain (e.g., of approximately ½ L0) to form a narrow guiding pattern 203 to form first and second plates of a vertical plate capacitor from the merged plate area 202.

Figure 3:
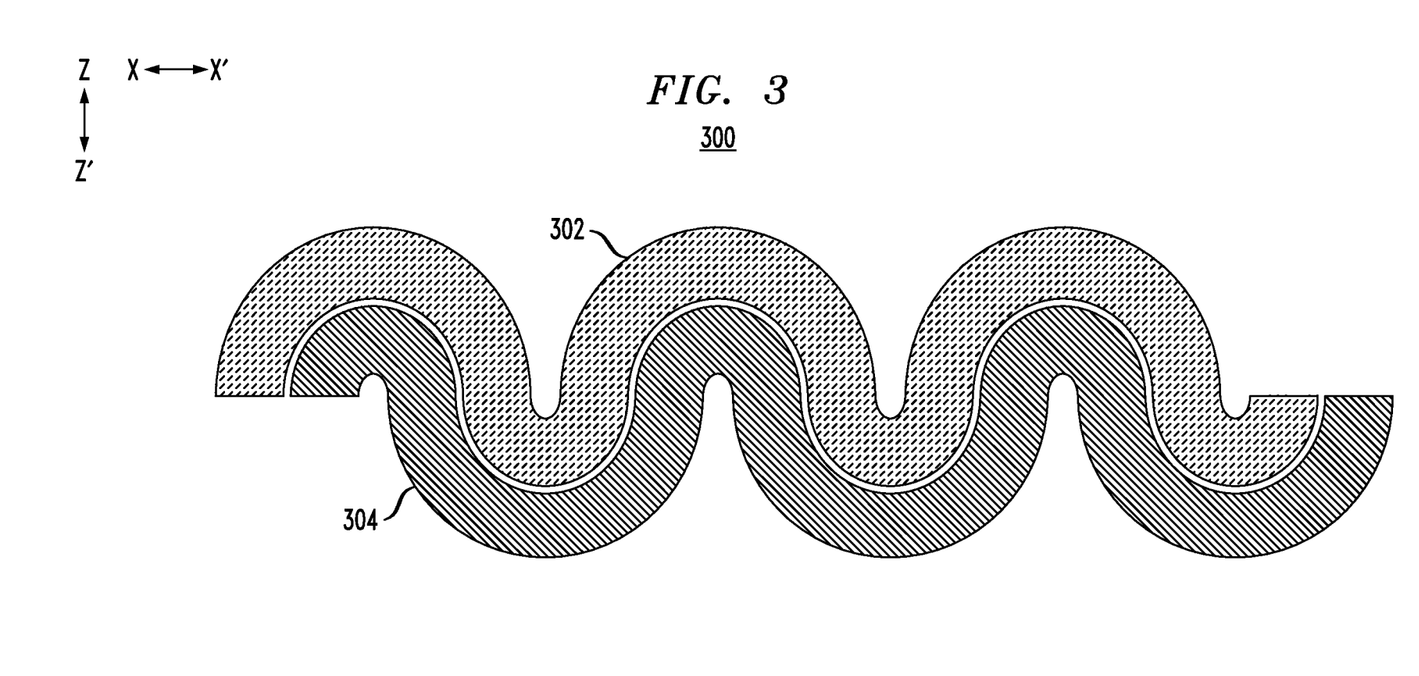
FIG. 3 depicts a top-down view of another vertical plate capacitor structure, according to an embodiment of the invention.

FIG. 3 shows a top-down view 300 of another vertical plate capacitor structure including a first plate 302 and a second plate 304. The first plate 302 and second plate 304 may be formed of similar materials as that described above with respect to the first plate 102 and second plate 104, respectively. Whereas the FIG. 1 structure included serpentine plates 102 and 104 with roundabout sections connecting linear sections, the FIG. 3 structure includes serpentine plates 302 and 304 where the roundabout sections are directly connected to one another rather than connecting to linear sections.

Figure 4:
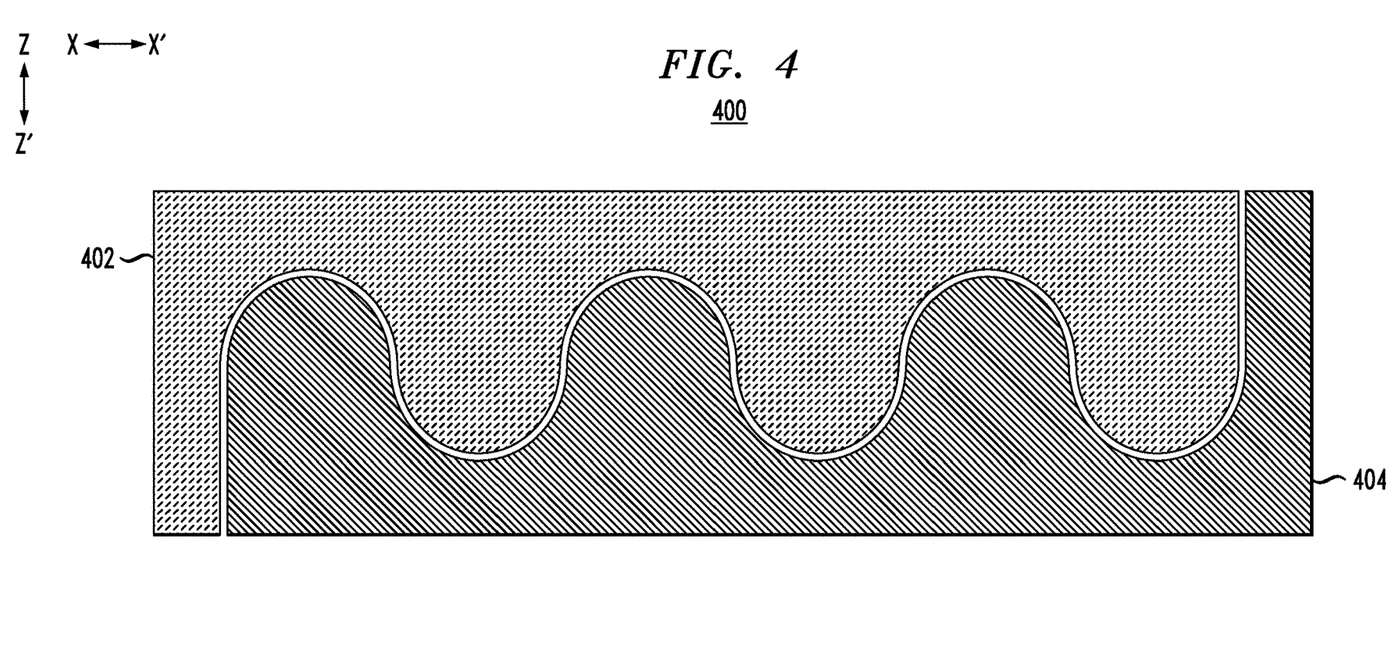
FIG. 4 depicts a top-down view of another vertical plate capacitor structure, according to an embodiment of the invention.

FIG. 4 shows a top-down view 400 of another vertical plate capacitor structure including a first plate 402 and a second plate 404. In the FIG. 4 structure, the boundary between the first plate 402 and second plate 404 is serpentine with a sinusoidal-like wave pattern gap therebetween. The first plate 402 and the second plate 404, however, collectively have a substantially rectangular boundary. This rectangular boundary may be desirable in certain applications, so as to fit better within a standard shape of a chip structure. The first plate 402 and second plate 404 may be formed of similar materials as the first plate 102 and second plate 104, respectively.

Figure 5:
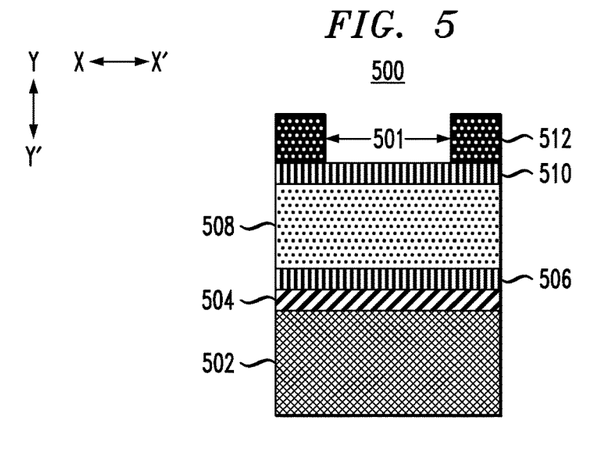
FIG. 5 depicts a cross-sectional view of a layer stack for forming a vertical plate capacitor structure, according to an embodiment of the invention.

FIG. 5 shows a cross-sectional view 500 of a layer stack that may be used to form a vertical plate capacitor structure (e.g., one of the vertical plate capacitor structures shown in FIGS. 1, 3 and 4). The layer stack includes a base layer or substrate 502, a hard mask layer 504, a coating layer 506, an optical planarization layer (OPL) 508, a coating layer 510, and photoresist layer 512.

The base layer 502 may be formed of any suitable dielectric material, such as tetraethyl orthosilicate (TEOS) oxide. The base layer 502 may have a width or horizontal thickness (in direction X-X') ranging from 50 nm to 50 µm. The base layer 502 may have a height or vertical thickness (in direction Y-Y') ranging from several hundred nm to several µm. The base layer 502 may be formed using CVD or other suitable processing.

The hard mask layer 504 is disposed over the top surface of the base layer 502. The hard mask layer 504 may be formed of titanium nitride (TiN) or another suitable material such as silicon nitride (SiN). The hard mask layer 504 may have a height or vertical thickness (in direction Y-Y') ranging from 5 nm to 50 nm. The hard mask layer 504 may be formed using CVD or other suitable processing.

The coating layer 506 is disposed over the top surface of the hard mask layer 504. The coating layer 506 may be formed of a silicon-containing antireflective coating (SiARC) material, or another suitable material such as silicon dioxide ($SiO_2$). The coating layer 506 may have a height or vertical thickness (in direction Y-Y') ranging from 5 nm to 50 nm. The coating layer 506 may be formed using CVD or other suitable processing.

The OPL 508 is disposed over the top surface of the coating layer 506, and may be formed of any suitable OPL material. The OPL 508 may have a height or vertical thickness (in direction Y-Y') ranging from 50 nm to 200 nm. The OPL layer 508 may be formed using spin-on dielectric or other suitable processing.

The coating layer 510 is disposed over the top surface of the OPL 508. The coating layer 510, similar to coating layer 508, may be formed of a SiARC material. The coating layer 510 may be formed with similar size and similar processing as that described above with respect to coating layer 508.

The photoresist layer 512 is patterned over the top surface of the coating layer 510 as illustrated in FIG. 5. The photoresist layer 512 may be patterned such that the opening 501 has a width in the range of 10 nm to 120 nm.

Figure 6:
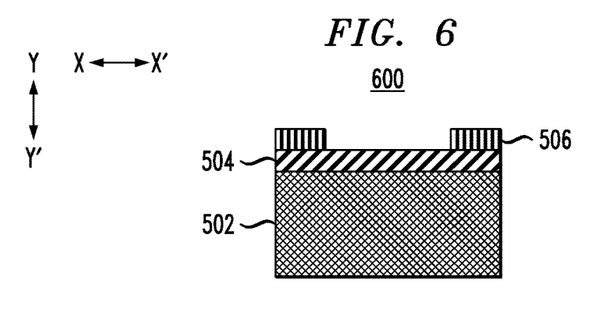
FIG. 6 depicts a cross-sectional view of the FIG. 5 structure following etching of the layer stack, according to an embodiment of the invention.

FIG. 6 shows a cross-sectional view 600 of the FIG. 5 structure following etch back of the layer stack to result in the structure shown. The etching of the photoresist layer 512, coating layer 510, OPL 508 and coating layer 506 may utilize multiple reactive-ion etching (ME) steps or other etch processes. The resulting structure includes the base layer 502, the hard mask layer 504, and a patterned coating layer 506 having an opening which matches the patterned opening 501 in the photoresist layer 512.

Figure 7:
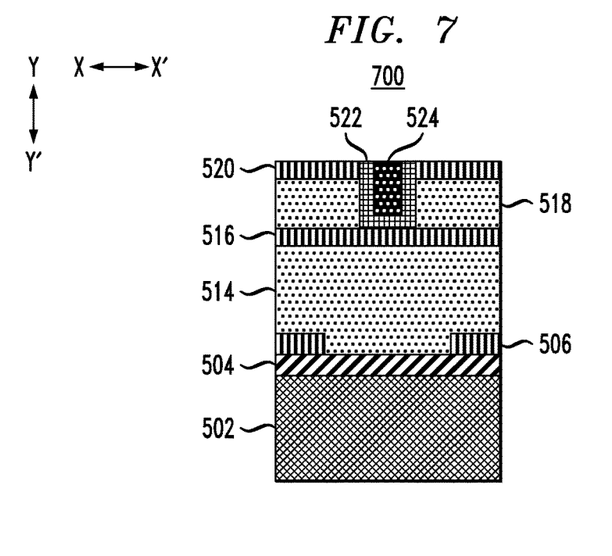
FIG. 7 depicts a cross-sectional view of the FIG. 6 structure following formation of a directed self-assembly stack, according to an embodiment of the invention.

FIG. 7 shows a cross-sectional view 700 of the FIG. 6 structure following formation of a DSA stack, including formation of an OPL 514, a coating layer 516, an OPL 518, a coating layer 520, and a block copolymer including a first polymer 522 and second polymer 524.

The OPL 514 and OPL 518 may be formed of similar materials and with similar processing as that described above with respect to OPL 508. The OPL 514 may have a height or vertical thickness (in direction Y-Y') ranging from 50 nm to 400 nm, and the OPL 518 may have a height or vertical thickness (in direction Y-Y') ranging from 50 nm to 200 nm.

The coating layer 516 and coating layer 520 may be formed of similar materials and with similar processing as that described above with respect to coating layer 504. The coating layer 516 may have a height or vertical thickness (in direction Y-Y') ranging from 5 nm to 50 nm, and the coating layer 520 may have a height or vertical thickness (in direction Y-Y') ranging from 5 nm to 50 nm.

The first polymer 522 and the second polymer 524 provide a block copolymer, where the first polymer 522 and the second polymer 524 are blended and bound together during formation, such as using spin coating or another suitable technique such as physical vapor deposition (PVD). An anneal process may be used to separate the first polymer 522 and the second polymer 524 (e.g., separate the block copolymer into first and second domains primarily composed of the respective polymers that form the block copolymer). This anneal process may vary based on the particular block copolymer that is used.

In some embodiments, the first polymer 522 may be polystyrene (PS) and the second polymer 524 may be poly(methyl methacrylate) (PMMA), where the block copolymer is referred to as PSP-MMA or PS-PMMA. Using these materials for the DSA structure, the anneal process to separate the block copolymer into the first polymer 522 and second polymer 524 may comprise a thermal anneal, such as a thermal anneal done on a hot plate with temperatures ranging from 70 degrees Celsius (° C.) to 250° C. for a duration in the range of a few seconds to several hours, or a vapor phase based annealing process.

After the anneal to separate the block copolymer DSA structure into the first polymer 522 and the second polymer 524, the second polymer 524 may have a width of approximately ½ L0. Different types of DSA materials or block copolymers have different associated L0 or pitch of separation values. For example, using a PSP-MMA block copolymer, the value of L0 may be approximately 28 nm.

The block copolymer, after separation into the first polymer 522 and second polymer 524, may be used to establish the guiding pattern width for forming a vertical plate capacitor structure with a small distance d between its plates. This is because the material of the first polymer 522 and the material of the second polymer 524 react differently to different etchants, and thus the material of the second polymer 524 can be removed selective to the material of the first polymer 522 as will be described in further detail below.

Figure 8:
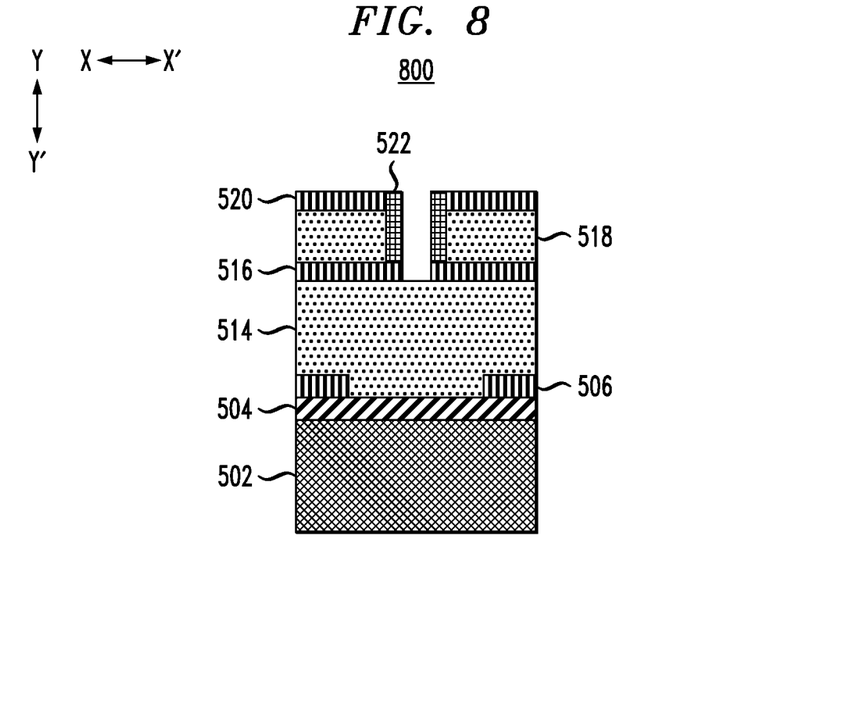
FIG. 8 depicts a cross-sectional view of the FIG. 7 structure following etching of one of the polymers in the directed self-assembly stack, according to an embodiment of the invention.

FIG. 8 shows a cross-sectional view 800 of the FIG. 7 structure following etching or removal of the second polymer 524 from the DSA stack. In some embodiments, the second polymer 524 is removed using a dry etch such as an $O_2$ plasma RIE that selectively etches polymer 524 but not polymer 522. Following removal of the second polymer 524, the portion of the first polymer 522 and the coating layer 516 beneath the second polymer 524 are removed using two consecutive etch processes, one for breaking or etching the bottom layer of polymer 522 and another for breaking or etching the exposed coating layer 516.

Figure 9:
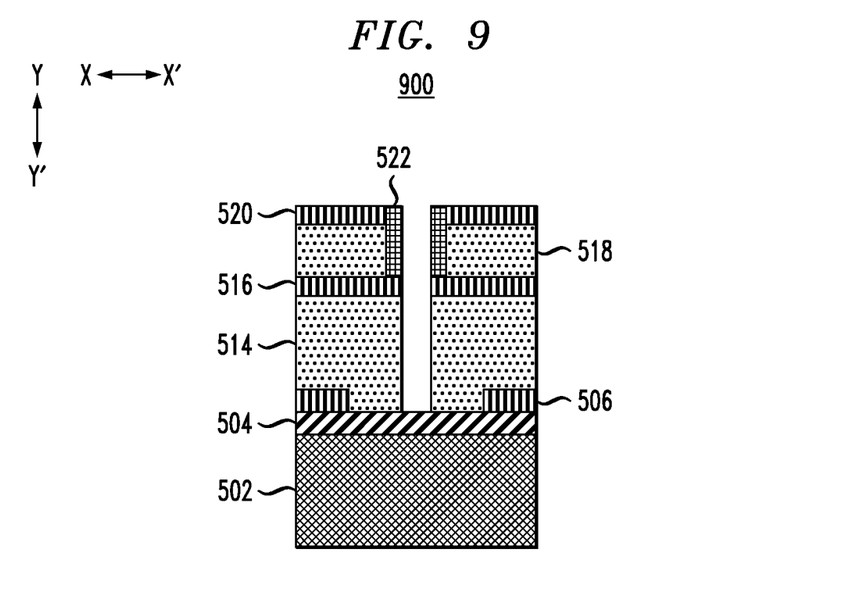
FIG. 9 depicts a cross-sectional view of the FIG. 8 structure following further etching of an optical planarization layer of the directed self-assembly stack, according to an embodiment of the invention.

FIG. 9 shows a cross-sectional view 900 of the FIG. 8 structure following etching of the exposed OPL layer 514 to reveal a portion of the top surface of the hard mask layer 504. The OPL layer 514 may be etched using a dry etch such as a RIE process.

Figure 10:
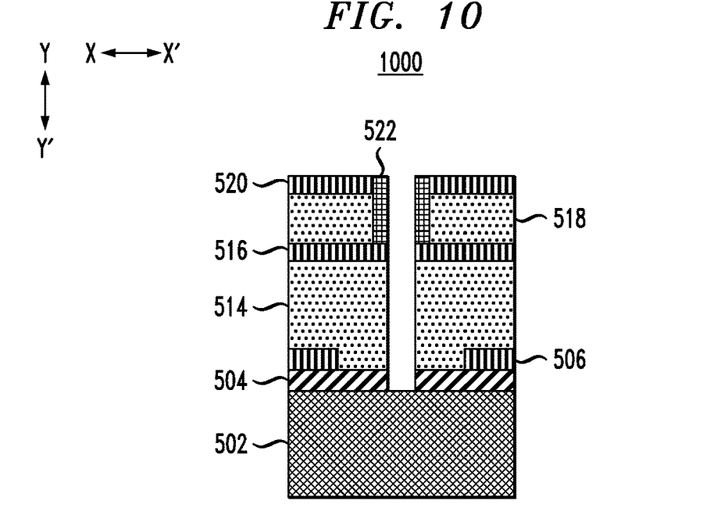
FIG. 10 depicts a cross-sectional view of the FIG. 9 structure following further etching of a hard mask layer, according to an embodiment of the invention.

FIG. 10 shows a cross-sectional view 1000 of the FIG. 9 structure following further etching of an exposed portion of the hard mask layer 504. The hard mask layer 504 may be etched using a dry etch such as a sulfur hexafluoride (SF6)-based plasma etch process.

Figure 11:
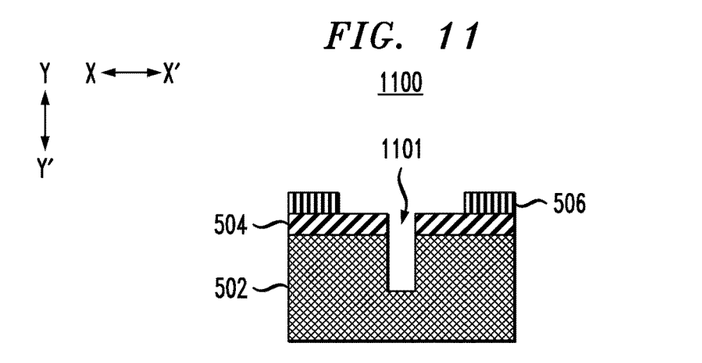
FIG. 11 depicts a cross-sectional view of the FIG. 10 structure following etching of a trench in a base layer and removal of a remaining portion of the directed self-assembly stack according to an embodiment of the invention.

FIG. 11 shows a cross-sectional view 1100 of the FIG. 10 structure following removal of the coating layer 520, OPL 518, coating layer 516, OPL 514 and first polymer 522. These layers may be removed using multiple etch process steps that are selective to the particular layers or films being etched.

Also shown in FIG. 11 is a trench 1101 etched in the base layer 502. The trench 1101 may be etched to a depth (in direction Y-Y') in the range of 100 nm to several microns below a top surface of the base layer 502. The trench 1101 may be etched using an anisotropic etch such as a $CH_3$-based RIE process. The trench 1101 may have a width or horizontal thickness (in direction X-X') in the range of 10 nm to 25 nm (e.g., a width of ½ L0 or smaller where the value of L0 is based on the particular materials used in the DSA stack as described above).

Figure 12:
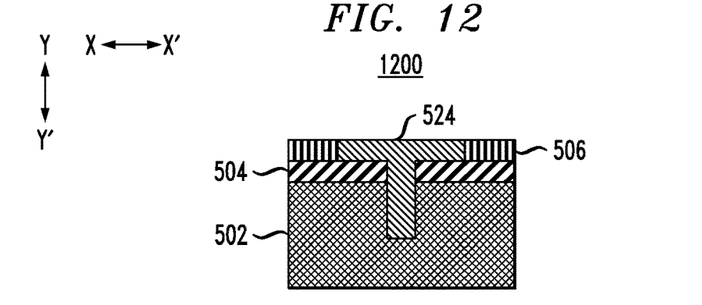
FIG. 12 depicts a cross-sectional view of the FIG. 11 structure following fill and planarization of a dielectric layer, according to an embodiment of the invention.

FIG. 12 shows a cross-sectional view 1200 of the FIG. 11 structure following fill and planarization of a dielectric layer 524. The dielectric layer 524 may be formed of any suitable dielectric material. In some embodiments, the dielectric layer 524 is formed of a high-k (or high ε) dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg).

The dielectric layer 524 may be formed using chemical vapor deposition (CVD) or another suitable process to fill the trench 1101 and overfill the hard mask layer 504 and coating layer 506. The dielectric layer 524 may then be planarized using chemical mechanical planarization (CMP) or other suitable processing such that the top surface of the dielectric layer 524 matches the top surface of the coating layer 506 as shown in FIG. 12.

Figure 13:
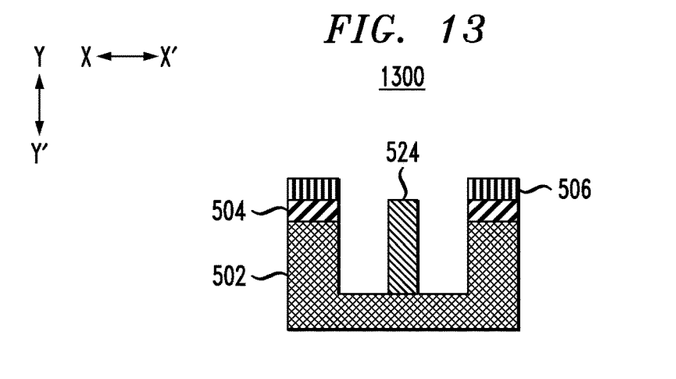
FIG. 13 depicts a cross-sectional view of the FIG. 12 structure following patterning and etching of the base layer, according to an embodiment of the invention.

FIG. 13 shows a cross-sectional view 1300 of the FIG. 12 structure following patterning and etching of the dielectric layer 524, the hard mask layer 504 and the base layer 502. First, the dielectric layer 524 may be etched using isotropic dielectric etch-back processing. The hard mask layer 504 and base layer 502 are then etched using a two-step RIE process selective to the high-k dielectric material 524. The base layer 502 may be etched to a depth that matches a bottom surface of the dielectric layer 524.

Figure 14:
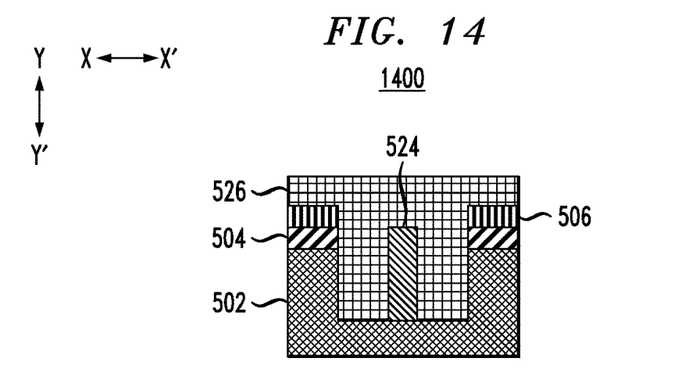
FIG. 14 depicts a cross-sectional view of the FIG. 13 structure following fill with a metal material, according to an embodiment of the invention.

FIG. 14 shows a cross-sectional view 1400 of the FIG. 13 structure following formation of a metal layer 526. The metal layer 526, as shown, fills the structure. The metal layer 526 may be formed using electrochemical deposition or other suitable processes. The metal layer 526 may be formed, for example, by electroplating of copper (Cu) followed by a Cu CMP process.

Figure 15:
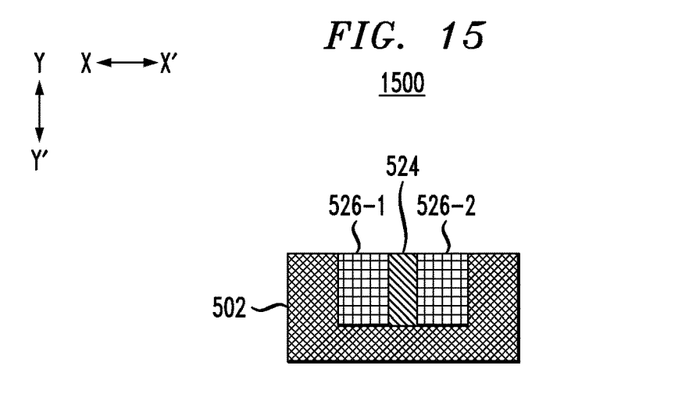
FIG. 15 depicts a cross-sectional view of the FIG. 14 structure following planarization to form the vertical plate capacitor structure, according to an embodiment of the invention.

FIG. 15 shows a cross-sectional view 1500 of the FIG. 14 structure following planarization using CMP or another suitable process to remove remaining portions of the coating layer 506 and the hard mask layer 504. The planarization also results in the formation of a vertical plate capacitor through separation of the metal layer 526 into a first vertical plate 526-1 and a second vertical plate 526-2. The vertical plate capacitor structure is a MIMcap structure, with the dielectric layer 524 providing an insulating layer between the first metal vertical plate 526-1 and the second metal vertical plate 526-2. Although not shown, subsequent processing may be performed on the FIG. 15 structure, such as formation of a dielectric overcoat to reduce a fringing field near the edge of the vertical plate capacitor structure.

Illustrative embodiments provide techniques for forming vertical plate capacitor structures with a very narrow gap between the vertical plates, and where a high-k dielectric material is formed in the narrow gap between the vertical plates. Vertical plate capacitor structures formed using such techniques advantageously exhibit high capacitance. The vertical plate capacitor structure may have a serpentine structure (e.g., connecting unit structures as shown and described above with respect to FIGS. 1 and 3). The vertical plate capacitor structure may also have vertical plates where the lines are not rectilinear, but rather conform to a sinusoid-like wave pattern (e.g., the structure shown and described above with respect to FIG. 4).

In some embodiments, vertical plate capacitor structures are formed close to a device (e.g., in a FEOL region of a chip structure). Further, some embodiments do not require connections to upper or lower layers of the chip structure. The vertical plate capacitor structure does not require vias to connect upper and lower metal layers (e.g., each of the vertical plates of capacitor structure in some embodiments is continuous in the same metal layer, not needing to connect many separate structures within the same layer through connections including vias and a second metal layer), and thus have the benefit of reduced resistance.

In some embodiments, a method of forming a semiconductor structure comprises forming a first trench in a substrate by transferring a patterning of a first polymer of a directed self-assembly stack, the directed self-assembly stack comprising the first polymer and a second polymer, forming a dielectric material in the first trench, forming a second trench in the substrate adjacent a first sidewall of the first trench, forming a third trench in the substrate adjacent a second sidewall of the first trench, forming a first vertical metal plate in the second trench, and forming a second vertical metal plate in third trench. The first vertical metal plate in the second trench, the dielectric material in the first trench, and the second vertical metal plate in the third trench form a metal-insulator-metal vertical plate capacitor.

The first trench may provide a serpentine pattern gap between the first vertical metal plate and the second vertical metal plate. The serpentine pattern may comprise one or more rectilinear segments connected to one or more rounded segments, two or more rounded segments connected to one another, or combinations thereof. In some embodiments, the first trench, the second trench and the third trench collectively provide a rectilinear trench in the substrate, and the serpentine pattern comprises a sinusoid-like wave pattern through the rectilinear trench in the substrate.

The first trench may have a width of 10 nm or less.

In some embodiments, the method further comprises forming an initial stack comprising the substrate, a hard mask layer disposed over the substrate, a first coating layer disposed over the hard mask layer, a first OPL disposed over the first coating layer, and a second coating layer disposed over the first OPL. The method may further comprise patterning a photoresist layer disposed over the second coating layer, etching portions of the second coating layer, the first OPL layer and the first coating layer exposed by the patterned photoresist layer, removing the patterned photoresist layer, and removing remaining portions of the second coating layer and the first OPL layer.

The method may further comprise forming the directed self-assembly stack, where the directed self-assembly stack comprises a second OPL layer disposed over the hard mask layer and remaining portions of the first coating layer, a third coating layer disposed over the second OPL layer, a block copolymer disposed over a portion of the third coating layer, a third OPL layer disposed over the third coating layer surrounding a first portion of the block copolymer, and a fourth coating layer disposed over the third OPL layer surrounding a second portion of the block copolymer.

The method may further comprise annealing the block copolymer to separate the block copolymer into the first polymer surrounded by the second polymer. The first polymer may comprise PS and the second polymer may comprise PMMA.

Transferring the patterning of the directed self-assembly stack to form the first trench may comprise patterning a mask over a top surface of the fourth coating layer and a top surface of the second polymer, removing the first polymer, removing a portion of the second polymer and the third coating layer exposed by the patterned mask, removing the patterned mask, removing an exposed portion of the second OPL layer, removing an exposed portion of the hard mask layer, removing remaining portions of the directed self-assembly stack, and forming the first trench in the substrate in an opening in the hard mask layer formed by removal of the exposed portion of the hard mask layer.

Forming the dielectric material in the first trench may comprise filling a high-k dielectric material in the first trench and over the hard mask layer and remaining portions of the first coating layer, and planarizing the high-k dielectric material.

Forming the second trench and forming the third trench may comprise etching the high-k dielectric material to expose a top surface of the hard mask layer, and etching exposed portions of the hard mask layer and the substrate to form the second trench on a first side of the high-k dielectric material and to form the third trench on a second side of the high-k dielectric material.

Forming the first vertical metal plate and forming the second vertical metal plate may comprise filling a metal layer in the second trench and the third trench and over the high-k dielectric layer, and planarizing the metal layer such that a top surface of the metal layer matches a top surface of the high-k dielectric material to separate the metal layer into the first vertical plate in the second trench and the second vertical plate in the third trench.

In some embodiments, a semiconductor structure comprises a substrate, a first trench comprising a dielectric material disposed in the substrate, the first trench comprising a transferred pattern of a first polymer of a directed self-assembly stack comprising the first polymer and a second polymer, a second trench comprising a first vertical metal plate disposed in the substrate adjacent a first sidewall of the first trench, and a third trench comprising a second vertical metal plate disposed in the substrate adjacent a second sidewall of the first trench. The first vertical metal plate in the second trench, the dielectric material in the first trench, and the second vertical metal plate in the third trench provide a metal-insulator-metal vertical plate capacitor.

The first trench may provide a serpentine pattern gap between the first vertical metal plate and the second vertical metal plate. The serpentine pattern may comprise one or more rectilinear segments connected to one or more rounded segments, two or more rounded segments connected to one another, or combinations thereof. In some embodiments, the first trench, the second trench and the third trench collectively provide a rectilinear trench in the substrate, and the serpentine pattern comprises a sinusoid-like wave pattern through the rectilinear trench in the substrate.

The first trench may have a width of 10 nm or less.

In some embodiments, an integrated circuit comprises a metal-insulator-metal vertical plate capacitor comprising a substrate, a first trench comprising a dielectric material disposed in the substrate, the first trench comprising a transferred pattern of a first polymer of a directed self-assembly stack comprising the first polymer and a second polymer, the dielectric material in the first trench providing the insulator of the metal-insulator-metal vertical plate capacitor, a second trench comprising a first vertical metal plate of the metal-insulator-metal vertical plate capacitor disposed in the substrate adjacent a first sidewall of the first trench, and a third trench comprising a second vertical metal plate of the metal-insulator-metal vertical plate capacitor disposed in the substrate adjacent a second sidewall of the first trench.

The first trench may provide a serpentine pattern gap between the first vertical metal plate and the second vertical metal plate. The serpentine pattern may comprise one or more rectilinear segments connected to one or more rounded segments, two or more rounded segments connected to one another, a sinusoid-like wave pattern through a rectilinear trench in the substrate provided by the first trench, the second trench and the third trench, or combinations thereof.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a first trench in a substrate by transferring a patterning of a first polymer of a directed self-assembly stack, the directed self-assembly stack comprising the first polymer and a second polymer;
    forming a dielectric material in the first trench;
    forming a second trench in the substrate adjacent a first sidewall of the first trench;
    forming a third trench in the substrate adjacent a second sidewall of the first trench;
    forming a first vertical metal plate in the second trench; and
    forming a second vertical metal plate in third trench;
    wherein the first vertical metal plate in the second trench, the dielectric material in the first trench, and the second vertical metal plate in the third trench form a metal-insulator-metal vertical plate capacitor.

2. The method of claim 1, wherein the first trench provides a serpentine pattern gap between the first vertical metal plate and the second vertical metal plate, the serpentine pattern comprising one or more rectilinear segments connected to one or more rounded segments.

3. The method of claim 1, wherein the first trench provides a serpentine pattern gap between the first vertical metal plate and the second vertical metal plate, the serpentine pattern comprising two or more rounded segments connected to one another.

4. The method of claim 1, wherein the first trench, the second trench and the third trench collectively provide a rectilinear trench in the substrate, and wherein the first trench provides a sinusoid-like wave pattern through the rectilinear trench in the substrate.

5. The method of claim 1, wherein the first trench has a width of 10 nanometers (nm) or less.

6. The method of claim 1, further comprising:
    forming an initial stack comprising the substrate, a hard mask layer disposed over the substrate, a first coating layer disposed over the hard mask layer, a first optical planarization layer (OPL) disposed over the first coating layer, and a second coating layer disposed over the first OPL;
    patterning a photoresist layer disposed over the second coating layer;
    etching portions of the second coating layer, the first OPL layer and the first coating layer exposed by the patterned photoresist layer;
    removing the patterned photoresist layer; and
    removing remaining portions of the second coating layer and the first OPL layer.

7. The method of claim 6, further comprising forming the directed self-assembly stack, the directed self-assembly stack comprising:
    a second OPL layer disposed over the hard mask layer and remaining portions of the first coating layer;
    a third coating layer disposed over the second OPL layer;
    a block copolymer disposed over a portion of the third coating layer;
    a third OPL layer disposed over the third coating layer surrounding a first portion of the block copolymer; and
    a fourth coating layer disposed over the third OPL layer surrounding a second portion of the block copolymer.

8. The method of claim 7, further comprising annealing the block copolymer to separate the block copolymer into the first polymer surrounded by the second polymer.

9. The method of claim 8, wherein the first polymer comprises polystyrene and the second polymer comprises poly(methyl methacrylate).

10. The method of claim 8, wherein transferring the patterning of the directed self-assembly stack to form the first trench comprises:
    patterning a mask over a top surface of the fourth coating layer and a top surface of the second polymer;
    removing the first polymer;
    removing a portion of the second polymer and the third coating layer exposed by the patterned mask;
    removing the patterned mask;
    removing an exposed portion of the second OPL layer;
    removing an exposed portion of the hard mask layer;
    removing remaining portions of the directed self-assembly stack; and
    forming the first trench in the substrate in an opening in the hard mask layer formed by removal of the exposed portion of the hard mask layer.

11. The method of claim 10, wherein forming the dielectric material in the first trench comprises:
    filling a high-k dielectric material in the first trench and over the hard mask layer and remaining portions of the first coating layer; and
    planarizing the high-k dielectric material.

12. The method of claim 11, wherein forming the second trench and forming the third trench comprises:
    etching the high-k dielectric material to expose a top surface of the hard mask layer; and
    etching exposed portions of the hard mask layer and the substrate to form the second trench on a first side of the high-k dielectric material and to form the third trench on a second side of the high-k dielectric material.

13. The method of claim 12, wherein forming the first vertical metal plate and forming the second vertical metal plate comprise:
    filling a metal layer in the second trench and the third trench and over the high-k dielectric layer; and
    planarizing the metal layer such that a top surface of the metal layer matches a top surface of the high-k dielectric material to separate the metal layer into the first vertical plate in the second trench and the second vertical plate in the third trench.

14. A semiconductor structure, comprising:
- a substrate;
- a first trench comprising a dielectric material disposed in the substrate, the first trench comprising a transferred pattern of a first polymer of a directed self-assembly stack comprising the first polymer and a second polymer;
- a second trench comprising a first vertical metal plate disposed in the substrate adjacent a first sidewall of the first trench; and
- a third trench comprising a second vertical metal plate disposed in the substrate adjacent a second sidewall of the first trench;
- wherein the first vertical metal plate in the second trench, the dielectric material in the first trench, and the second vertical metal plate in the third trench provide a metal-insulator-metal vertical plate capacitor.

15. The semiconductor structure of claim 14, wherein the first trench provides a serpentine pattern gap between the first vertical metal plate and the second vertical metal plate, the serpentine pattern comprising one or more rectilinear segments connected to one or more rounded segments.

16. The semiconductor structure of claim 14, wherein the first trench provides a serpentine pattern gap between the first vertical metal plate and the second vertical metal plate, the serpentine pattern comprising two or more rounded segments connected to one another.

17. The semiconductor structure of claim 14, wherein the first trench, the second trench and the third trench collectively provide a rectilinear trench in the substrate, and wherein the first trench provides a sinusoid-like wave pattern through the rectilinear trench in the substrate.

18. The semiconductor structure of claim 14, wherein the first trench has a width of 10 nanometers (nm) or less.

19. An integrated circuit comprising:
- a metal-insulator-metal vertical plate capacitor comprising:
  - a substrate;
  - a first trench comprising a dielectric material disposed in the substrate, the first trench comprising a transferred pattern of a first polymer of a directed self-assembly stack comprising the first polymer and a second polymer, the dielectric material in the first trench providing the insulator of the metal-insulator-metal vertical plate capacitor;
  - a second trench comprising a first vertical metal plate of the metal-insulator-metal vertical plate capacitor disposed in the substrate adjacent a first sidewall of the first trench;
  - a third trench comprising a second vertical metal plate of the metal-insulator-metal vertical plate capacitor disposed in the substrate adjacent a second sidewall of the first trench.

20. The integrated circuit of claim 19, wherein the first trench provides a serpentine pattern gap between the first vertical metal plate and the second vertical metal plate, wherein at least one of:
- the serpentine pattern comprises one or more rectilinear segments connected to one or more rounded segments;
- the serpentine pattern comprises two or more rounded segments connected to one another; and
- the serpentine pattern comprises a sinusoid-like wave pattern through a rectilinear trench in the substrate provided by the first trench, the second trench and the third trench.

* * * * *